United States Patent
Rexberg et al.

(12) 
(10) Patent No.: US 7,932,790 B2
(45) Date of Patent: Apr. 26, 2011

(54) SWITCHED MODULATION OF A RADIO-FREQUENCY AMPLIFIER

(75) Inventors: Leonard Rexberg, Hässelby (SE); Håkan Malmqvist, Hägersten (SE); Thomas Lejon, Vallentuna (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 200 days.

(21) Appl. No.: 12/443,704

(22) PCT Filed: Oct. 27, 2006

(86) PCT No.: PCT/SE2006/050432
§ 371 (c)(1),
(2), (4) Date: Mar. 31, 2009

(87) PCT Pub. No.: WO2008/051127
PCT Pub. Date: May 2, 2008

(65) Prior Publication Data
US 2010/0097153 A1   Apr. 22, 2010

(51) Int. Cl.
*H03K 7/08* (2006.01)
(52) U.S. Cl. .................. 332/109; 330/10; 375/238

(58) Field of Classification Search .................. 332/109; 330/10; 375/238
See application file for complete search history.

(56) References Cited

U.S. PATENT DOCUMENTS

| 5,963,106 A * | 10/1999 | Blyth et al. .................. 332/109 |
| 6,107,876 A * | 8/2000 | O'Brien .......................... 330/10 |
| 7,078,964 B2 * | 7/2006 | Risbo et al. .................... 330/10 |
| 2004/0246060 A1 | 12/2004 | Varis et al. |

FOREIGN PATENT DOCUMENTS

| EP | 1161044 A2 | 12/2001 |
| EP | 1662665 A1 | 5/2006 |
| WO | 2005/015732 A2 | 2/2005 |
| WO | 2006/070319 A1 | 7/2006 |

* cited by examiner

*Primary Examiner* — Joseph Chang
(74) *Attorney, Agent, or Firm* — Coats & Bennett, P.L.L.C.

(57) ABSTRACT

Switch-modulation of a radio-frequency power amplifier by-representing the input signal by the I-signal (1) and Q-signal (9) of the complex components (I+j−Q), and pulse width modulating the I-signal and the Q-signal separately to create a modulated I-signal pulse sequence (3*a*) and a modulated Q-signal pulse sequence (3*b*). Further, the pulses corresponding to negative sample values are time-shifted relative the pulses corresponding to positive sample values, and each pulse of the I-signal pulse sequence is delayed by introducing a delaying time shift.

18 Claims, 13 Drawing Sheets ically a factor 10 higher than the signal bandwidth, for the frequency f₇ of the amplified base band signal. sample is mapped onto the position of the pulse 3 within the time interval between two samples Ts=T_{s1}-T_{s0}, i.e. the sampling interval or sampling period

SWITCHED MODULATION OF A RADIO-FREQUENCY AMPLIFIER

TECHNICAL FIELD

The present invention relates to a method and an arrangement of switch-modulating a radio-frequency power amplifier.

BACKGROUND

A power amplifier for a telecommunication system, e.g. for an RF (radio frequency)-signal transmitter in a base station or a satellite system, may have to amplify frequencies spread over a bandwidth of up to 100 MHz, due to simultaneous amplification of multiple carrier signals. Further, it is desirable that an RF amplifier has a high efficiency and dynamic range, as well as a high linearity in order to reduce the distortion.

A class D power amplifier for example, is a power amplifier in which all power devices operate in a switched (ON/OFF)-mode, and it may be switch-modulated e.g. by PWM (Pulse Width Modulation), whereby a high power efficiency can be obtained. Switched-modulation techniques normally involve a conversion of an input signal to a pulse sequence having a much higher frequency content than the input signal, a subsequent amplification of the pulse sequence, followed by filtering to remove unwanted spectral components, such as e.g. the carrier frequency harmonics or modulation noise. The resulting filtered signal corresponds to an amplified replica of the input signal. An advantage of a Class D power amplifier is the high power efficiency, which is achieved by the pulse sequence having a fixed amplitude and the switching elements being either ON or OFF, which causes a low power dissipation.

In the above-mentioned PWM, the input signal to the amplifier is modulated to give the pulses in the pulse sequence a duration, i.e. a pulse width, that is proportional to the signal amplitude. At the output from the amplifier, the pulse train is filtered with a band-pass filter to obtain its prior shape, without the presence of higher order harmonics. PWM is commonly used in power electronics, e.g. for controlling an electric engine or for power conversion, and further in audio systems, in which the introduction of PWM reduces the need for cooling of the amplifiers, as well as the size. However, in radio-frequency applications, the use of switch-modulated Class D power amplifiers is still limited due to the high switching frequencies that are needed, e.g. in the GHz-range.

Another example is a Class E amplifier, which is a high-efficient switching power amplifier that is suitable for radio-frequency signals, and consists of a single transistor driven as a switch and a passive load network.

FIG. 1 is a block diagram illustrating a conventional architecture of a switch-modulator 2, consisting of a pulse width modulator (PWM) arranged to modulate a base band input signal 1 and to present a pulse-sequence 3 forming a binary-level signal to a power amplifier 4. Since the power amplifier can be constantly driven at its maximum-efficiency operating point, the overall efficiency for the amplification of a typical amplitude-varying and phase-varying signal will be very high. Thereafter, the amplified pulse sequence 5 is filtered by a properly designed filter 6 tuned around the carrier frequency, preferably by a band pass filter for PWM, in contrast to the low pass filters for PWM commonly used for power converters or audio system, in order to filter out a correct amplified output signal 7.

In conventional PWM (Pulse Width Modulation), the amplitude of a signal is mapped onto the width of a pulse at each sample, and a single pulse is transmitted by the modulator for each incoming sample. However, e.g. in radio communication systems is required that the phase information of the signal is mapped onto some aspect of the pulse, e.g. the position, to thereby create a pulse sequence representing both the amplitude and the phase of the signal, constituting a PPM (Pulse Position Modulation) that is used together with the PWM, i.e. PWM/PPM. FIG. 2 illustrates how the amplitude of a signal 1 sampled at $T_{s0}$ is mapped onto the width, i.e. duration, of a modulated pulse 3, and the phase of the signal sample is mapped onto the position of the pulse 3 within the time interval between two samples $Ts=T_{s1}-T_{s0}$, i.e. the sampling interval or sampling period The technique explained in FIG. 2 is applied in the conventional arrangement illustrated in FIG. 3, in which the amplitude-part 1 and the phase-part 9 of a baseband signal are modulated by a conventional, combined PWM/PPM 8, by which the amplitude modulates the width of a pulse and the phase modulates the position of said pulse within the sampling period of the baseband signal. FIG. 3 further shows a pulse sequence 3 created by the combined PWM/PPM 8 and onto which both the amplitude and phase of the base band signal 1 is mapped, as described above. Thereafter, the pulse sequence 3 is amplified by the power amplifier 4, and the amplified pulse sequence 5 is filtered by the band pass filter 6, resulting in an amplified base band signal 7 on the output.

Related art within the technical field is disclosed e.g. in US2004/0246060, which describes a modulator for generating a two-level signal suitable for amplification by a switching mode power amplifier, such as a Class D or a Class E amplifier.

It is further known within this technical field to combine the above-described PWM (pulse-width modulation) and PPM (pulse-position modulation) with Delta-Sigma (DS) modulation, by presenting the amplitude-part of a complex baseband signal to a 3-level Delta-Sigma-modulator, while the phase-part of the signal is presented to a DS-modulator having 8 levels. In DSM (Delta-Sigma modulation), the input signal to an amplifier is converted to a pulse sequence having a fixed pulse width and a frequency that is higher than the carrier frequency, and the average level of the bit-stream represents the input signal level. Normally, the sampling frequency $f_s$=4·carrier frequency, such as in a $f_s/4$ DS-modulator, resulting in a sampling frequency of e.g. 8.56 GHz in a frequency band of the 3GPP (The $3^{rd}$ Generation Partnership Project). In the architecture illustrated in the block diagram in FIG. 4, the output signals from two Delta-Sigma modulators 10a, 10b are presented to a pulse-width modulating part and a pulse-position modulating part, respectively, of a combined PPW/PPM 8, to form a pulse train that has the combined characteristics of DS-modulation and PWM/PPM. The DS-modulator produces a noise-shaped spectrum, while the PWM/PPM produces a signal that consists of only those pulses that are needed to feed a switched amplifier. A signal produced by the PWM/PPM does not change as rapidly as a signal coming from a DS-modulator, which contains broadband noise with a spectral density comparable to that of the useful signal.

In the above-described FIG. 4, the amplitude-part 1 and the phase-part 9 of an input base band signal are modulated by two Delta-Sigma modulators 10a, 10b and thereafter modulated by a combined PWM/PPM 8. Since the mapping of the input amplitude onto a pulse width is a non-linear function, i.e. a sine-function, an inverse (i.e. arcsine) pre-distorter is needed to obtain a linear output, and this correction is precalculated in the correcting calculator 11 in the illustrated arrangement in FIG. 4. The phase information of the input signal is converted to a pulse position of the pulse sequence 3, e.g. by phase modulating an oscillator working on the intended carrier frequency, or by up-converting the base band signal to RF and extracting the phase information. Thereafter, the Delta Sigma-modulated and PW/PP-modulated signal 3 is amplified by the power amplifier 4 and filtered by the band-pass filter 6.

However, the above-described conventional arrangements, as well as related art within the technical field, involve several drawbacks. For example, a combined pulse width- and pulse position-modulation with a fixed sample period, T, may lead to so-called "wrap-around" of a pulse, which is illustrated in FIG. 5. The pulse representing the sample at $T_{s0}$ is "wrapped" within the sample period, since this first pulse cannot extend over to the next sample interval. Instead, a second pulse will be transmitted during the next interval, and this second pulse will represent the amplitude and phase of the second sample, at $T_{s1}$.

Another drawback with the combined PW/PP-modulation is the time granularity of a digitally defined pulse width and position, which restricts the achievable dynamic range due to quantization noise. At least 512 levels would be required for the width or positioning in order to reach 60-70 dB dynamic range, and this requires a clock frequency and a speed of the digital circuitry that is not achievable today. This problem can be alleviated by means of PW/PP modulation with coarse time granularity (3/8 levels) in combination with DS-modulation, but the dynamic range of the output signal is still very low, typically in the order of 40 dB for a single-carrier WCDMA (Wideband Code Division Multiple Access), and an extensive filtering is needed to reduce out of band noise to acceptable levels.

Thus, it still presents a problem to achieve a high-efficient switch-modulated power amplifier for radio-frequency signals that is capable of linear amplification of radio-frequency signals over a large bandwidth with a high dynamic range and without "wrap-around" problems.

SUMMARY

The object of the present invention is to address the problem outlined above, and to provide an improved switch-modulation of a radio-frequency power amplifier, involving a low power dissipation, a high linearity over a large bandwidth, as well as a high dynamic range. This object and others are achieved by the method and arrangement of switch-modulating a radio-frequency power amplifier according to the appended claims.

According to one aspect, the invention provides a method of switch-modulating a radio-frequency power amplifier, in which method the input signal is represented by the I-signal and Q-signal of the complex components (I+j·Q). Further, the method performs sampling and pulse width modulation of the I-signal and the Q-signal separately to create a modulated I-signal pulse sequence and a modulated Q-signal pulse sequence, time shifting of the pulses corresponding to negative sample values relative the pulses corresponding to positive sample values, and a delay of each pulse of the I-signal pulse sequence by introducing a delaying time shift.

Thereby, a highly efficient and linear amplification of can be obtained over a large bandwidth and with a high dynamic range. Since the modulation is performed only by pulse width modulation, and not by position modulation, the phase wrap-around problem is avoided. Further, the delaying time shift of the I-signal pulse sequence will simplify the combination of the two orthogonal components into the complex representation.

Additionally, new samples values may be interpolated to be mapped on the time shifted pulses, thereby achieving a more correct mapping of the amplitudes.

The method may also perform a power amplification of the I-signal pulse sequence and the Q-signal pulse sequence separately, a subsequent combination of the amplified I-signal pulse sequence and the amplified Q-signal pulse sequence, and a filtering of the amplified and combined pulse sequences to create a correct output signal.

The pulse width modulation comprises mapping of the sample amplitude on the width of a pulse of a pulse sequence, and the amplitude may be corrected to obtain a linear function. The delaying time shift in the I-branch may be 0.25 $T_s$, which corresponds to a 90-degree phase shift, and the time shift of the negative sample pulses relative the positive pulses may place the negative sample pulses in the second half of the sampling interval $T_s$ and the positive sampling pulses in the first half of the sampling interval, e.g. the positive sample pulses being placed at 0.25 $T_s$ and the negative sample pulses placed at 0.75 $T_s$.

Additionally, the filtering may comprise band-pass filtering, in order to obtain the frequency of interest, and said interpolation may involve linear interpolation between two adjacent samples, or cubic spline interpolation.

According to another aspect, the invention provides an arrangement of switch-modulating a radio-frequency power amplifier by a separate modulation of the I-signal and the Q-signal of the complex components (I+j·Q) of an input signal. The arrangement comprises pulse width modulators for sampling and modulating the I-signal and the Q-signal separately to create a modulated I-signal pulse sequence and a modulated Q-signal pulse sequence, a time shifter for displacing the pulses corresponding to negative sample values relative the pulses corresponding to positive sample values within the sampling interval, and a delay unit for introducing a delaying time shift in the I-signal pulse sequence.

The arrangement may further comprise an interpolator for interpolating new sample amplitudes to be mapped on the width of each of the time shifted pulses, and power amplifiers for amplification of the I-signal pulse sequence and the Q-signal pulse sequence separately, a combiner of the amplified I-signal pulse sequence and the amplified Q-signal pulse sequence, and a filter for band-pass filtering the combined pulse sequences to create a correct amplified output signal of the frequency of interest.

A pulse width modulator is arranged to map a sample amplitude on the width of a pulse, and may further comprise a correcting calculator for obtaining a linear relationship between the pulse width and the sample amplitude.

The delaying time shift may be 0.25 $T_s$, which corresponds to a 90-degree phase shift of the modulated I-signal pulse sequence, the interpolators may comprises a linear interpolator or a cubic spline interpolator, and the power amplifiers may be a Class D or a Class E amplifier.

BRIEF DESCRIPTION OF THE DRAWINGS

The present invention will now be described in more detail and with reference to the accompanying drawings, in which.

DETAILED DESCRIPTION

Figure 1:
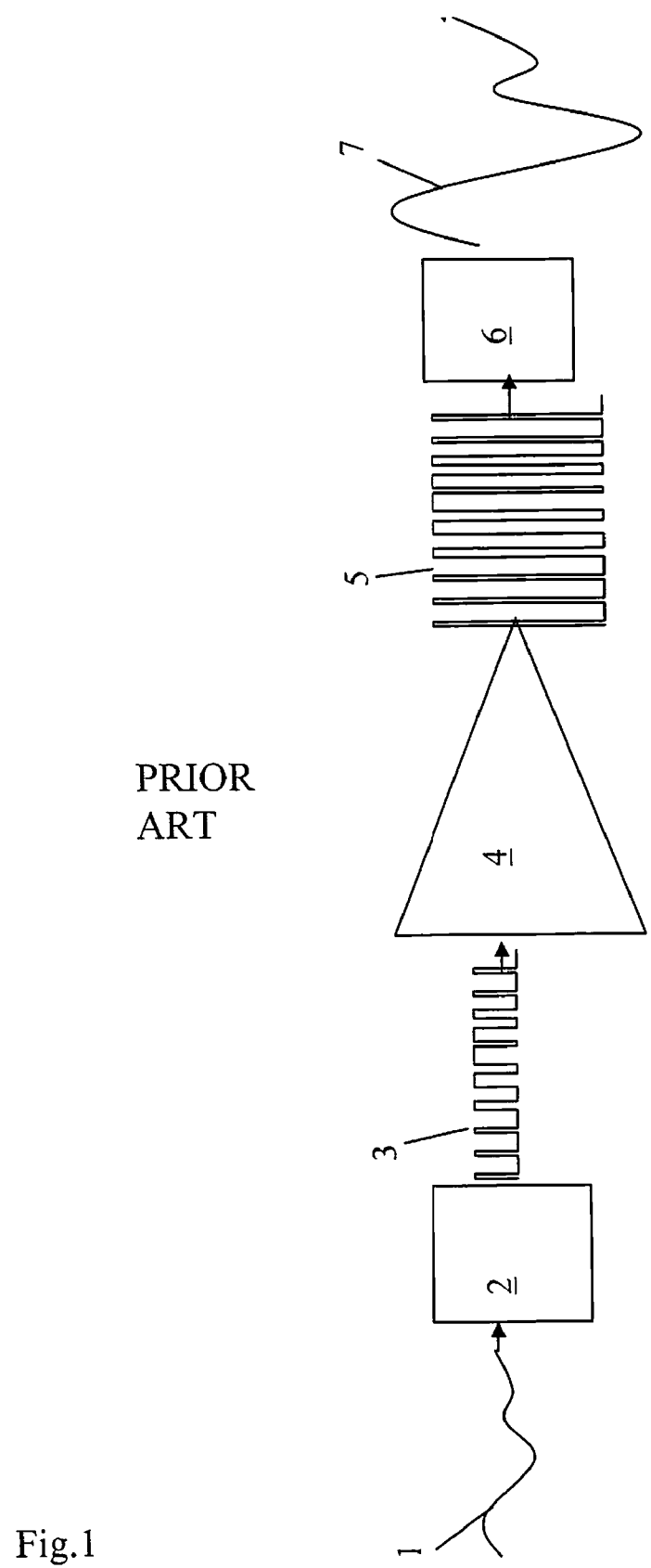
FIG. 1 is a block diagram schematically illustrating a conventional arrangement of a pulse width modulator.

In the following description, specific details are set forth, such as a particular architecture and sequences of steps in order to provide a thorough understanding of the present invention. However, it is apparent to a person skilled in the art that the present invention may be practised in other embodiments that may depart from these specific details.

Moreover, it is apparent that the described functions may be implemented using software functioning in conjunction with a programmed microprocessor or a general purpose computer, and/or using an application-specific integrated circuit. Where the invention is described in the form of a method, the invention may also be embodied in a computer program product, as well as in a system comprising a computer processor and a memory, wherein the memory is encoded with one or more programs that may perform the described functions.

This invention relates to an improved switch-modulation of a radio-frequency power amplifier, and the modulation method is capable of mapping information regarding both the amplitude and the phase of the base band signal. Instead of mapping the phase on the position of the pulse between two samples, as in conventional pulse position/pulse phase modulation, the switch-modulation according to this invention is performed by two functionally separate pulse-width modulators. The input baseband signal is represented by the Cartesian coordinates of a complex number, expressed as I+j·Q, of which the real component I represents the In-phase component and the imaginary component Q represents the Quadrature-phase component of the signal. One of the two separate pulse width modulators modulates the in-phase component, hereinafter denoted the I-signal, and the other modulates the quadrature-phase component, hereinafter denoted the Q-signal. The pulse width modulators map the amplitude of a sample onto the width of a pulse, and negative and positive sample amplitudes are indicated by a time-shift of the negative sampling pulse relative the positive sampling pulses within the sampling interval, and, according to a further embodiment of the invention, new interpolated sample amplitudes are calculated in order to compensate for the time-shifts.

In order to forward the complex number I+j·Q representing the base band signal, and not the real part (I) and the imaginary part (Q) separately, the two signals are preferable transformed to one signal corresponding to I+j·Q after the amplification of the separate signals. Since a multiplication by "j" corresponds to a delay of 90°, the transformation of the two separate signals I and Q involves a delay, i.e. a time-shift, of the I-branch by $0.25\,T_s$, of which the sampling period $T_s$ is the sampling period at radio frequency (RF), and according to a further embodiment of the invention, new interpolated sample amplitudes are calculated in order to compensate for the time-shift. The delay may be performed directly in time domain before the two amplifiers, or by means of physically delaying the signals with a quarter-wave transmission line, e.g. by a hybrid combiner having an integrated delaying transmission line section. Thereafter, the output signals from the two power amplifiers can be combined, e.g. in an ordinary RF branch line coupler, in order to achieve I+j·Q, which is filtered in order to create a correct, amplified radio-frequency signal at the output.

Figure 6:
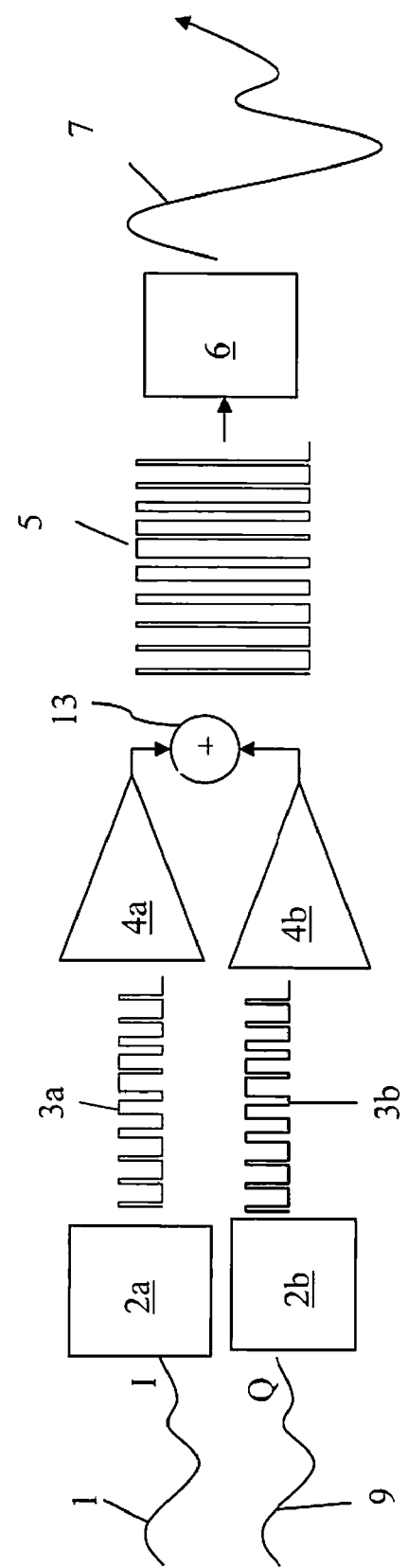
FIG. 6 is a block diagram schematically illustrating switch modulation of a power amplifier according to a first embodiment of this invention.

FIG. 6 is a block diagram illustrating a first embodiment of this invention, performing pulse-width modulation of the I-signal branch 1 and of the Q-signal branch 9 of a base band signal by means of two functionally separate pulse-width modulators 2a, 2b. The resulting two separate pulse sequences 3a, 3b are amplified by two functionally separate power amplifiers 4a, 4b, and the amplified signals are combined by a suitable combiner 13, thereby creating a combined amplified pulse sequence 5, which is filtered by a suitable band-pass filter 6, creating a correct amplified band-pass signal 7.

The negative samples of both the in-phase signal, i.e. the I-signal, and the quadrature-phase signal, i.e. the Q-signal, are handled by introducing a suitable time shift of the pulses corresponding to the negative samples relative the pulses corresponding to the positive samples, enabling a preserved binary coding. According to a further embodiment of the invention, the negative sample pulses are placed in the second half of the sampling interval $T_s=T_{s1}-T_{s0}$, and the positive samples in the first half. For example, the positive samples may be placed at $0.25\,T_s$ and the negative samples at $0.75\,T_s$ within the sampling interval $T_s$.

Further, due to this time shift, the real amplitude of the samples will deviate from the amplitude mapped onto the pulses, and therefore a new interpolated sample amplitude is calculated, according to a second embodiment of this invention.

Thus, according to this invention, two functionally separate power amplifiers are used to amplify the input signal consisting of one in-phase signal, I-signal, and one quadrature-phase signal, Q-signal. However, in order to obtain a correct complex amplified output radio frequency signal, the combining of the In-phase (I) and the Quadrature-phase (Q) signals is preceded by a delay of the I-signal, e.g. by a quarter of a sample interval (i.e. by $0.25\,T_s$) after the pulse width modulation. This means that the pulses of the I-signal pulse sequence are time-shifted by $0.25\,T_s$ within the sampling interval, such that the positive sample pulses may be placed at $0.5\,T_s$ and the negative sample pulses at $1\,T_s$, while the un-delayed Q-signal samples pulses may be placed at $0.25\,T_s$ and $0.75\,T_s$, respectively. This delay of the I-signal corresponds to a 90-degree phase shift, which simplifies a combination of the two orthogonal components into the complex representation I+j·Q.

Figure 2:
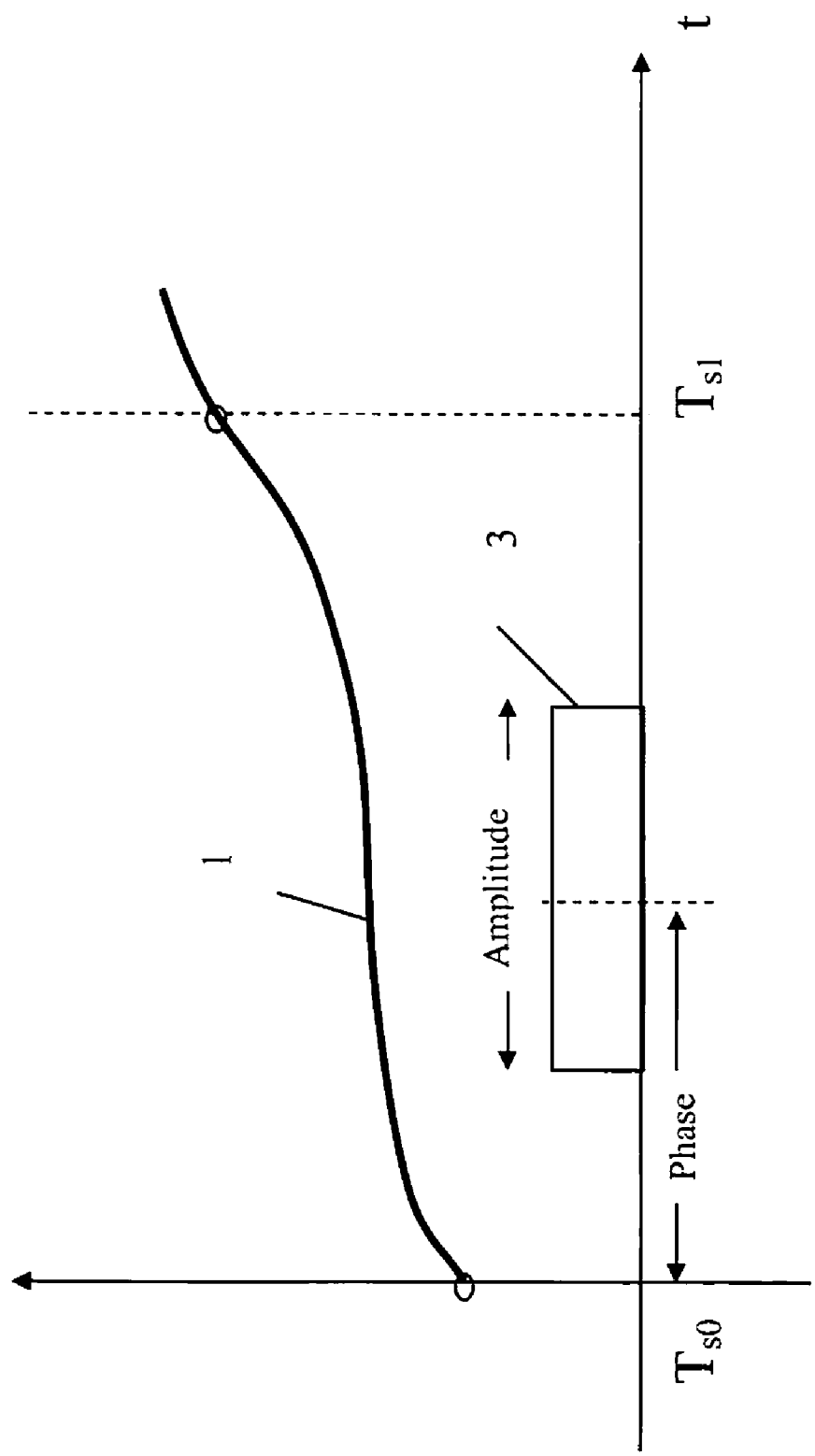
FIG. 2 illustrates mapping of the amplitude and phase of a signal onto a pulse.
Figure 3:
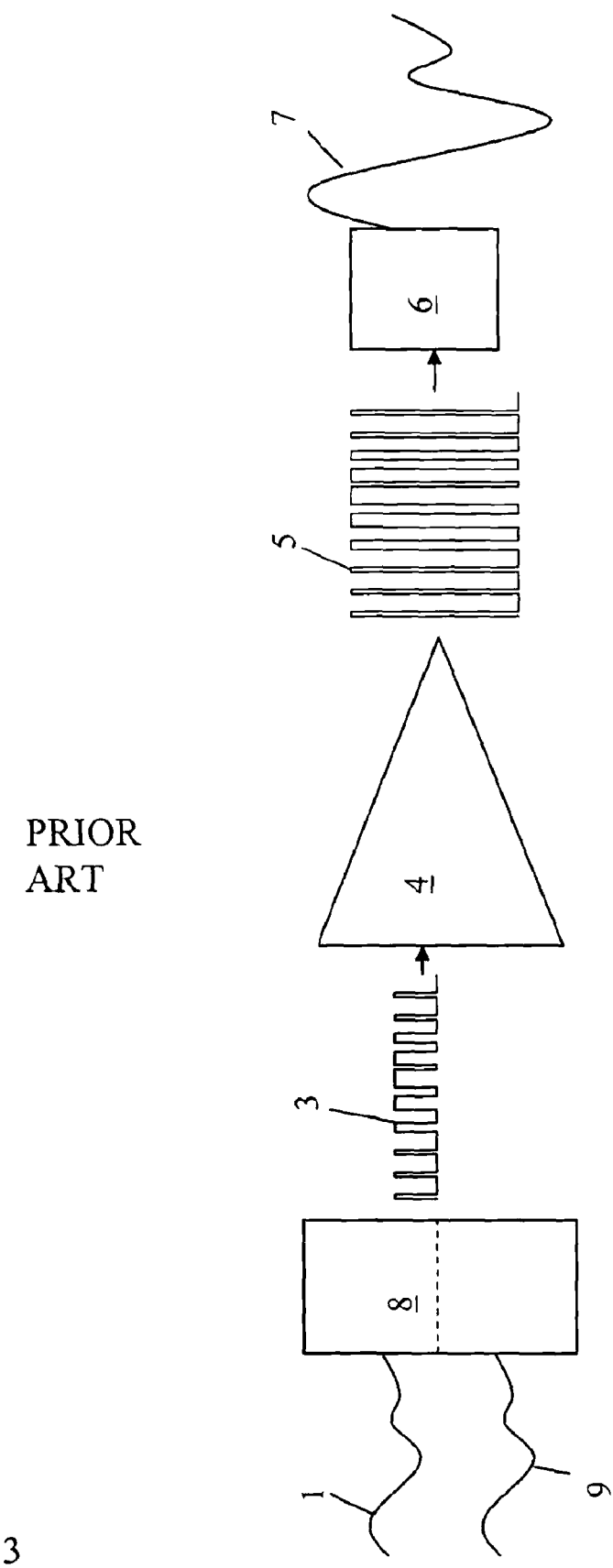
FIG. 3 is a block diagram illustrating a conventional arrangement of a combined pulse-width modulator and pulse position modulator.
Figure 4:
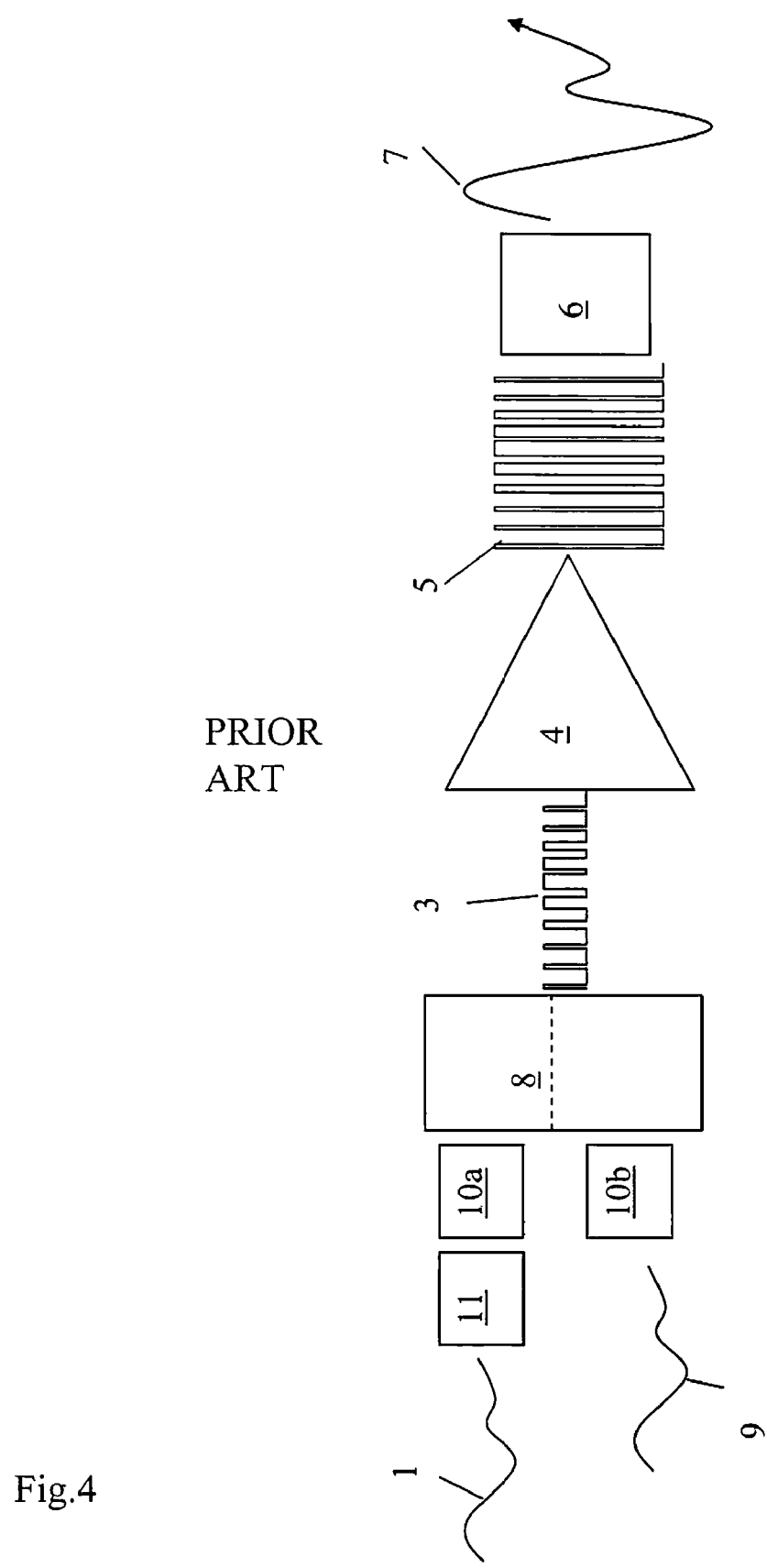
FIG. 4 is a block diagram illustrating a conventional arrangement of a combined Delta-Sigma modulator, pulse-width modulator and pulse position modulator.
Figure 5:
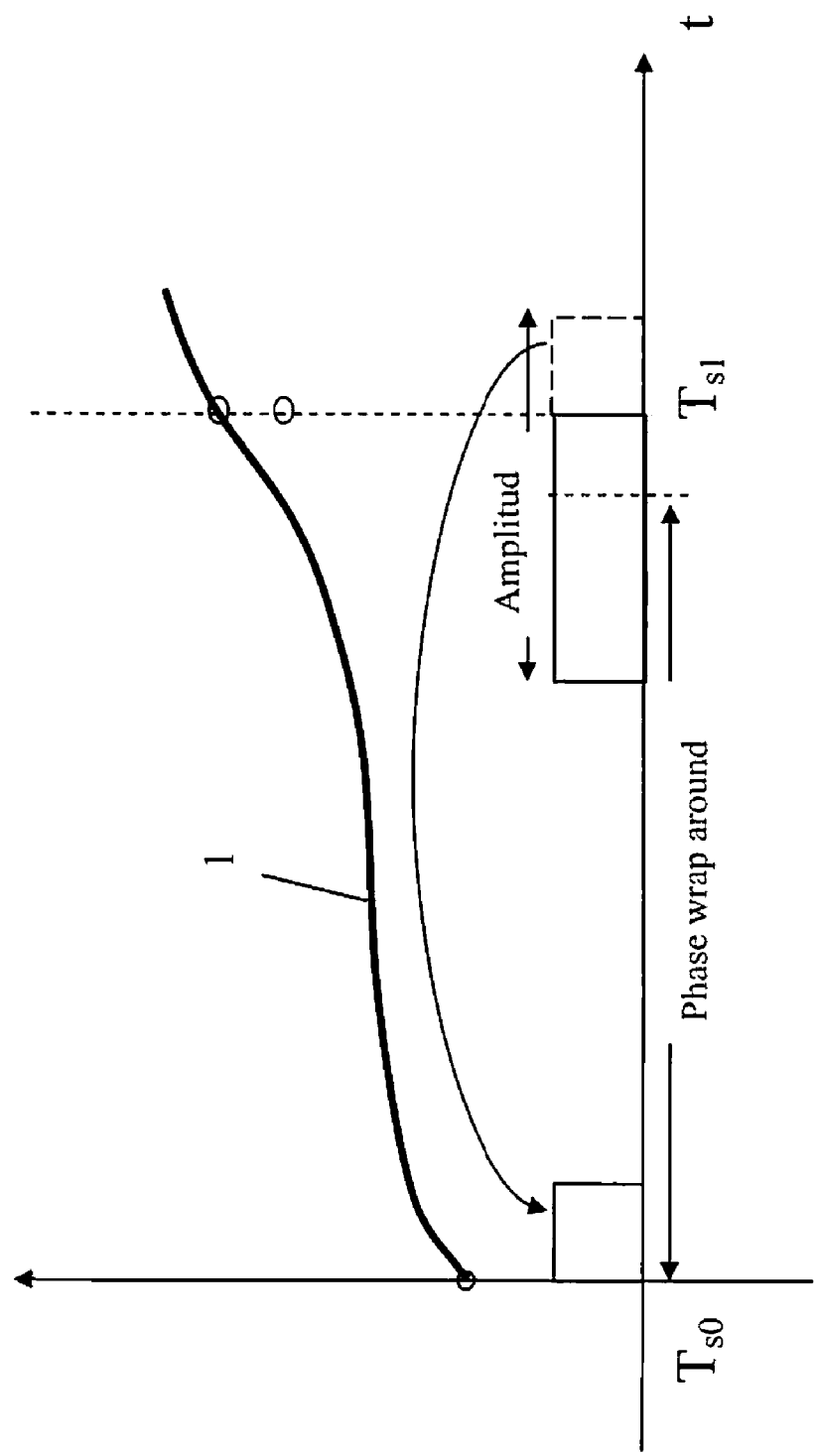
FIG. 5 illustrates "wrap around" that may occur when the phase of a signal is mapped onto the position of a pulse within a fixed sampling period.

Thus, the solution according to this invention is to apply PWM (pulse width modulation) on the Cartesian complex components and Q representing the input baseband signal, as illustrated in the block diagram of FIG. 6. A positive real signal, having only a positive component, can be mapped (as shown in FIG. 2) by the amplitude onto the width of the pulse e.g. by placing the pulse between two adjacent samples. However, a complex signal comprising both a real I-signal-component and an imaginary Q-signal-component is represented by both an I-signal and a Q-signal, according to this invention. FIG. 1 illustrates the switch-modulation according to an exemplary embodiment of this invention, involving a separate pulse width modulation of the I-signal and the Q-signal by representing the positive amplitude of the samples at $T_{s0}$ by the width of the pulses, and by placing the pulses centered around 0.5 $T_s$.

Figure 8:
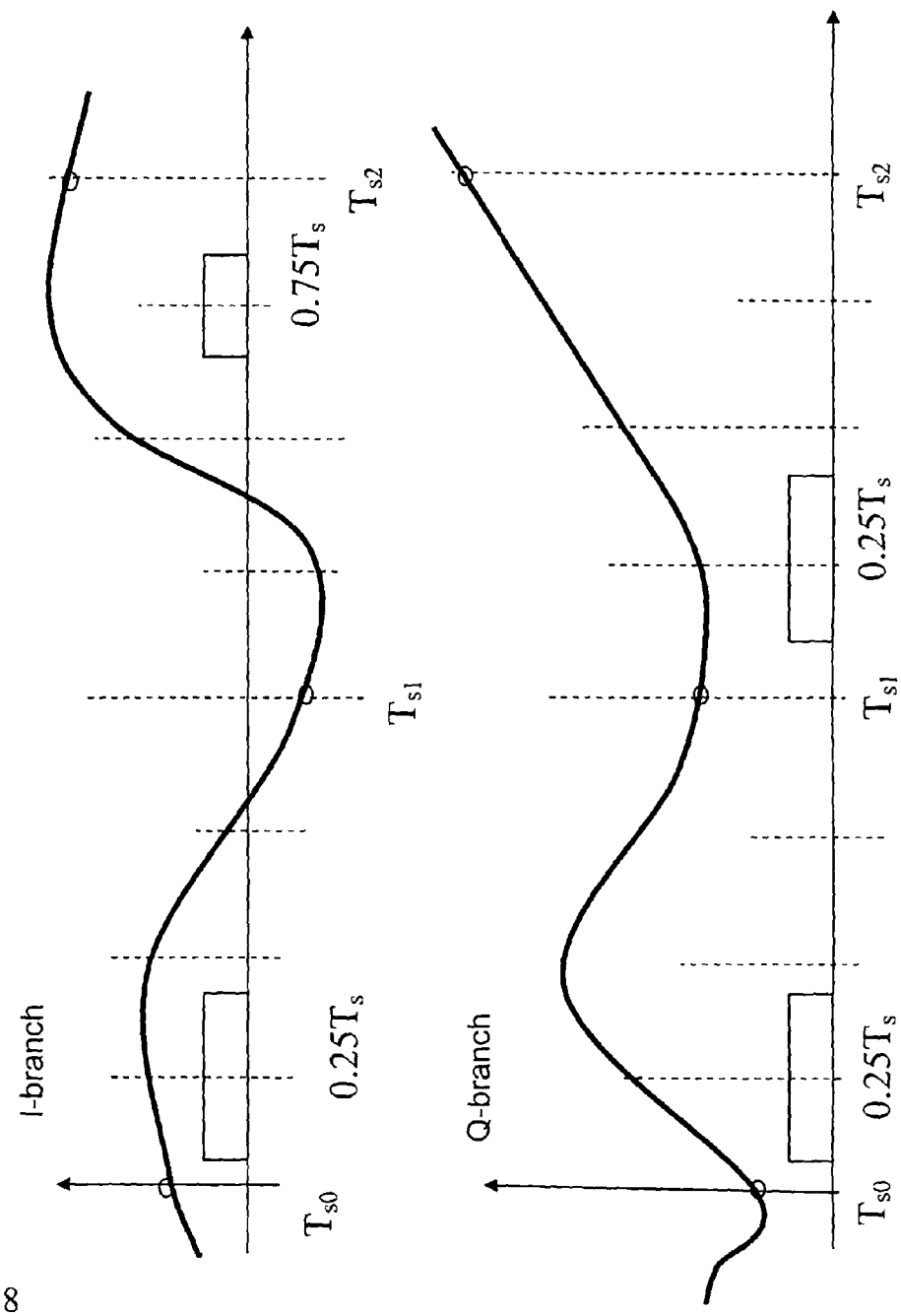
FIG. 8 illustrates mapping of positive or negative samples of the I-branch- and the Q-branch signals, according to this invention.

FIG. 8 illustrates the handling of negative samples, according to this invention, by time shifting of the negative sample pulses relative the positive sample pulses. A negative sample amplitude is mapped on a pulse by placing the pulse e.g. in the second half of the sampling period, which is illustrated in FIG. 8 by the sample in the I-branch at $T_{s1}$ being placed on 0.75 $T_s$, and by placing a pulse associated with a positive amplitude in the first half of the sampling period, as the illustrated sample at $T_{s0}$ in the I-branch, which is placed or 0.25 $T_s$. Correspondingly, a pulse associated with a positive amplitude in the Q-branch, e.g. as the illustrated sample at $T_{s0}$ and at $T_{s1}$, is placed in the first half of the associated sampling period, such as e.g. on 0.25 $T_s$. Thus, a complex signal is transformed into a real signal by assigning the pulses to slightly different positions within the sample interval $T_s$.

Obviously, the above described positions of 0.25 $T_s$ for positive sample values and 0.75 $T_s$ for negative sample values are only examples of suitable positions within the sample interval, and many other positions are possible. Further, the positive sample values may alternatively be placed in the second half of the sampling period, and the negative in the first half, and on other suitable positions than on 0.25 $T_s$ and on 0.75 $T_s$, such as e.g. on 0.30 $T_s$ and on 0.80 $T_s$, or on any other suitable position having a time difference of 0.5 $T_s$ between positive and negative samples.

Figure 9:
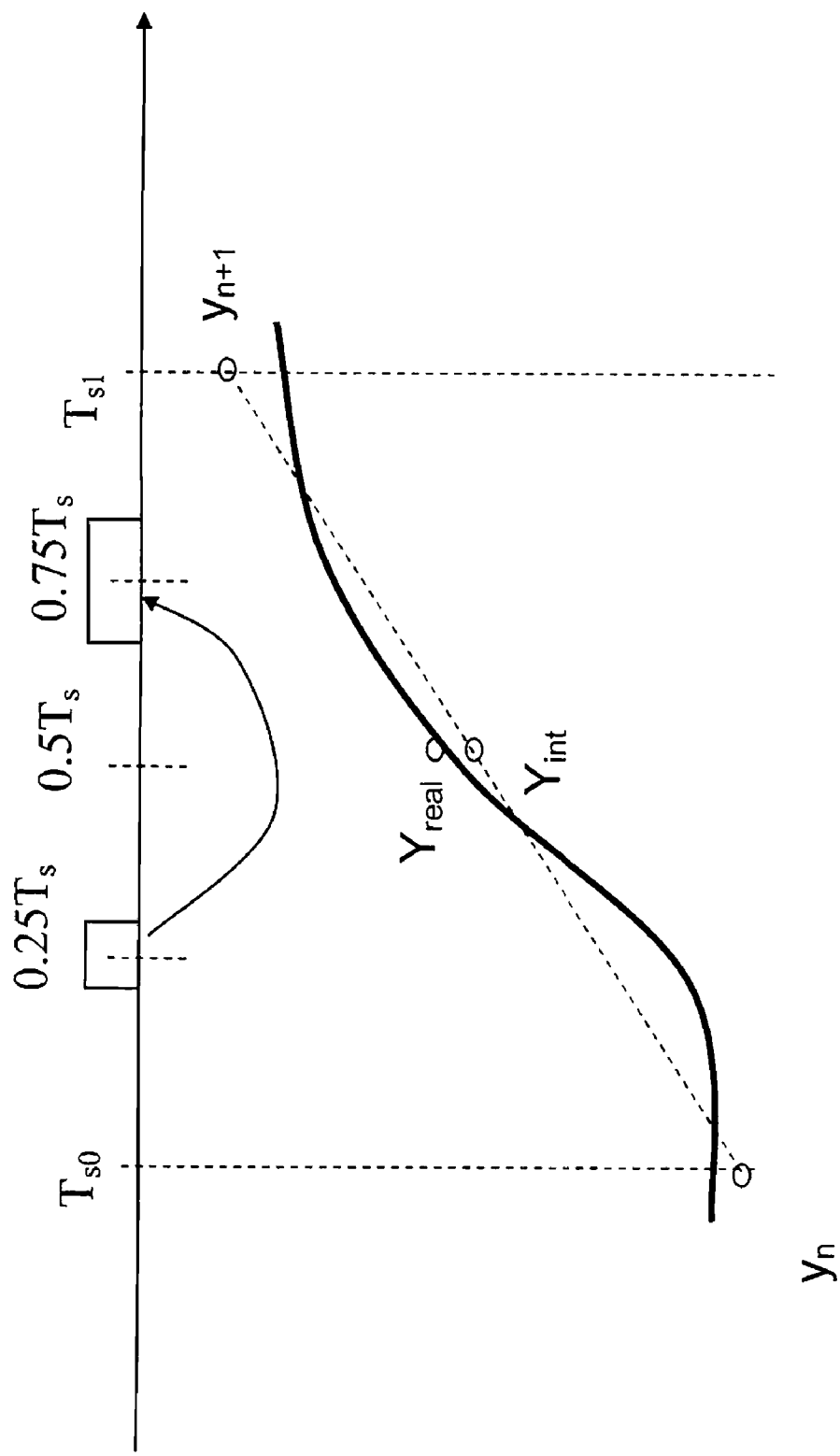
FIG. 9 illustrates linear interpolation of a new, time shifted sample value, according to an embodiment of this invention.

FIG. 9 illustrates handling of the offset of the negative pulses relative the sampling events, according to a second embodiment of this invention, due to the introduced time shift. If a pulse representing a negative sample at $t=T_{s0}$ is time shifted from its original position at 0.25 $T_s$, by half a sample period, i.e. by 0.5 $T_s$, to a new position at 0.75 $T_s$, the pulse width of the pulse does not represent the amplitude corresponding to its new position. Therefore, interpolation is performed to obtain an interpolated time shifted sample value $Y_{int}$ at $t=0.5$ $T_s$ to be mapped on the pulse width, as illustrated in FIG. 9. The interpolation may be performed by any suitable interpolation method, e.g. by a simple linear interpolation between the two nearest samples, or by cubic spline interpolation. According to an exemplary embodiment of this invention, which is illustrated in FIG. 9, interpolation of a time shifted negative sample value is performed by interpolating a time shifted sample at 0.5 $T_s$, and the interpolation method is linear interpolation using the formula:

$$y_{neg} = \frac{1}{2} \cdot (y_{n+1} + y_n)$$

In order to forward the complex number I+j·Q representing the base band signal, the two separate pulse sequences representing the modulated I- and Q-signals are transformed, or combined, into one signal corresponding to I+j·Q after the amplification of the separate signals. This combining is preceded by the delay of the I-branch by 0.25 $T_s$, since a multiplication by "j" corresponds to a phase shift of 90°, corresponding to a quarter of a period. Thereafter, the output signals from the two amplifiers can be combined e.g. in an ordinary RF branch line coupler. However, due to this delay, a similar interpolation as the one for the negative pulses is preferably performed for the new delayed pulse positions, both positive and negative, of the I-branch, according to a second embodiment of this invention, as illustrated in FIG. 10.

Figure 10:
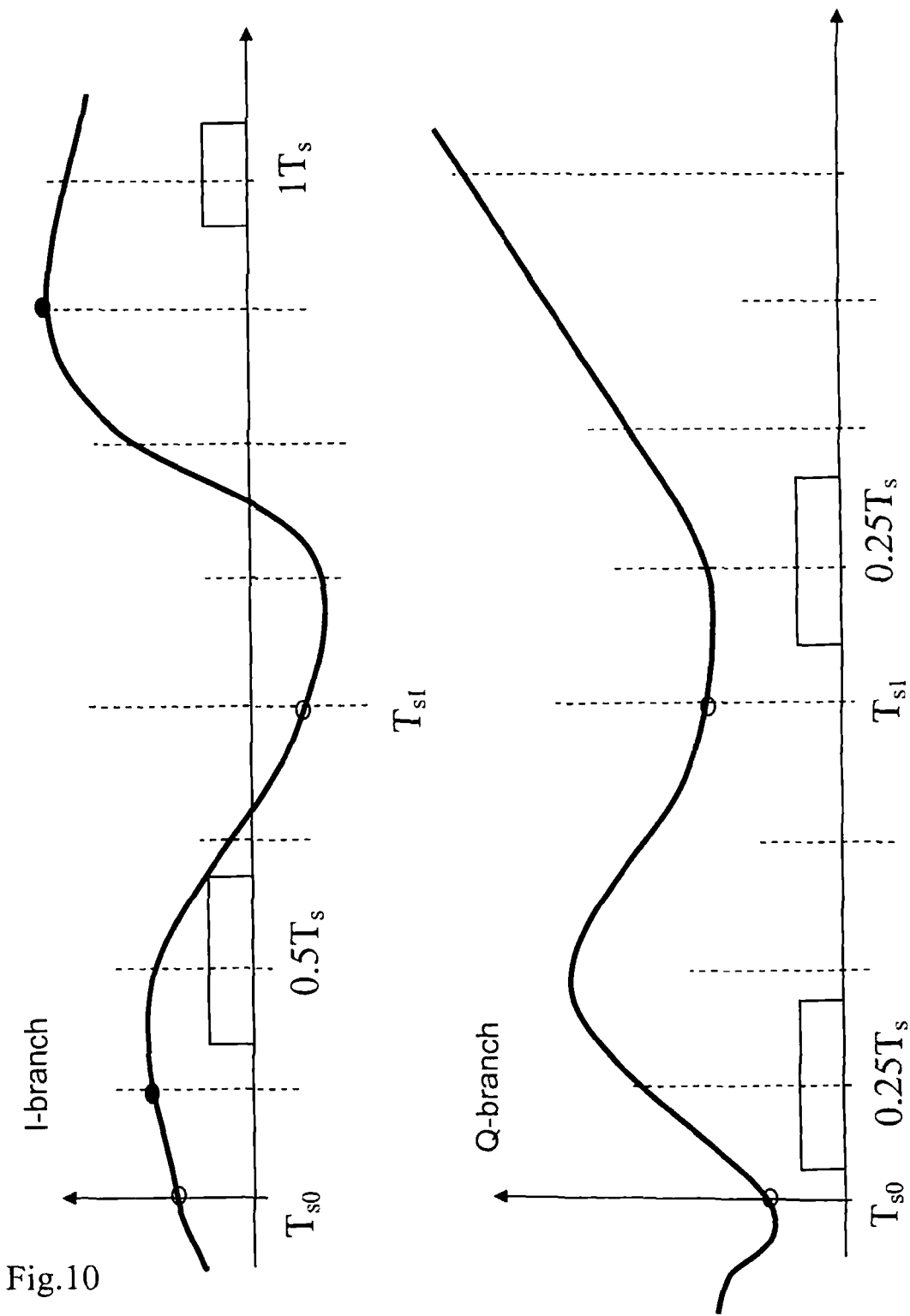
FIG. 10 illustrates interpolation of a time shifted sample values in the I-branch due to an introduced delay, according to a second embodiment of this invention.

In the I-branch of FIG. 10, a pulse corresponding to a n positive un-delayed $T_{s0}$-sample would be placed on 0.25 $T_s$. By introducing the delay by 0.25 $T_s$ in the I-branch in order to simplify the combination of the I-branch and the Q-branch, the pulse corresponding to a delayed $T_{s0}$-sample is time shifted and placed on 0.5%. However, in order to obtain a more correct mapping of the amplitude on the pulse width of the pulse on 0.5 $T_s$, the sample value at 0.25 $T_s$ is interpolated by any suitable interpolation method, e.g. by linear interpolation between the two nearest samples, at $T_{s0}$ and $T_{s1}$, thereby obtaining $T_{s0int}$.

The consecutive illustrated sample at $T_{s1}$ in the I-branch is negative, and a corresponding un-delayed pulse would e.g. be placed on 0.75 $T_s$. However, due to the introduced delay by 0.25 $T_s$, the corresponding pulse will be time shifted and placed on 1 $T_s$. In order to obtain a more correct amplitude mapping on the pulse width at 1 $T_s$, the sample value of the I-branch at 0.75 $T_s$ is interpolated by any suitable method, e.g. by a simple linear interpolation between the nearest two samples, $T_{s1}$ and $T_{s2}$, thereby obtaining $T_{s1int}$.

Thus, according to an exemplary embodiment of this invention, if a first sample is indicated as sample n, and consecutive sample is indicated by sample n+1, the interpolated time-shifted new first sample values of Q and I are:

$Q_{pos}=Q_n$, the time shift=0 for a positive sample value in the un-delayed Q-branch.

$Q_{neg}=Q_n+0.5(Q_{n+1}-Q_n)$, the time shift is 0.5 $T_s$ for a negative value in the Q-branch.

$I_{pos}=I_n+0.25(I_{n+1}-I_n)$, the time shift is 0.25 $T_s$ for a positive sample value in the I-branch with an introduced delay.

$I_{neq}=I_n+0.75(I_{n+1}-I_n)$, the time shift is 0.75 $T_s$ for a negative value in the I-branch with an introduced delay.

However, the interpolation must be re-calculated accordingly if any other suitable time shift is used.

Figure 11:
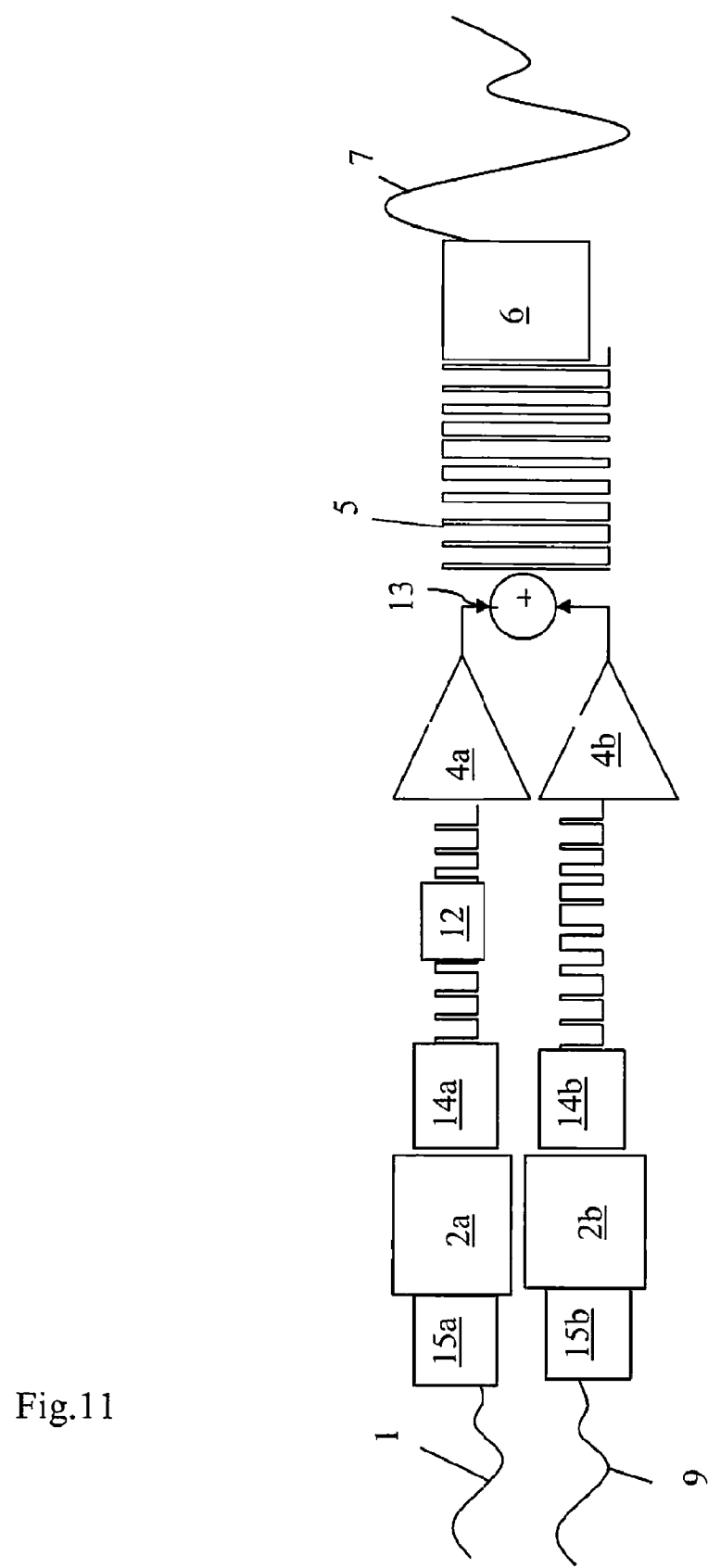
FIG. 11 is a block diagram schematically illustrating an arrangement of switch-modulating a power amplifier, according to a second embodiment of this invention.

FIG. 11 is a block diagram illustrating a second embodiment of the invention, comprising two functionally separate pulse width modulators 2a, 2b, for modulating the separate I-signal branch 1 and the separate Q-signal branch 9 of the complex representation I+j·Q of an input base band signal. In order to obtain linearity, a correction, e.g. by an arcsine-function, may be performed by a correction calculator (not illustrated in the figure) or directly in the two modulators 2a, 2b. The separate pulse width modulators create two separate pulse sequences corresponding to a modulated I-signal and Q-signal, respectively, and a pulse in the pulse sequence corresponding to negative sample value is time shifted by the time shifters 14a, 14b within the sampling interval relative a pulse corresponding to a positive sampling value. Further, in the pulse sequence 3a representing the modulated I-signal, a delay is introduced by a delay unit 12, preferably by 0.25 $T_s$, which corresponds to a multiplication by j, in order to simplify the combination of the I-signal branch and Q signal branch to re-create the complex base band signal I+j·Q. In order to improve the switch-modulation, an interpolation of new time shifted and delayed sample values is performed in interpolators, 15a, 15b, prior to the mapping of the amplitudes on the pulse width in the two modulators 2a, 2b. The first interpolator 15a for the I-branch interpolates new samples values due to the time shift of the negative sample values and the introduced delay in the I-branch, while the second interpolator 15b interpolates new sample values only due to the time shift of the negative values. The interpolated and time shifted pulse sequences are amplified by the power amplifiers, 4a, 4b, and combined in the combiner 13. Thereafter, the amplified and combined signal is filtered by a suitable band pass filter 6 in order to achieve an amplified output 7 of the input base band signal.

Figure 12:
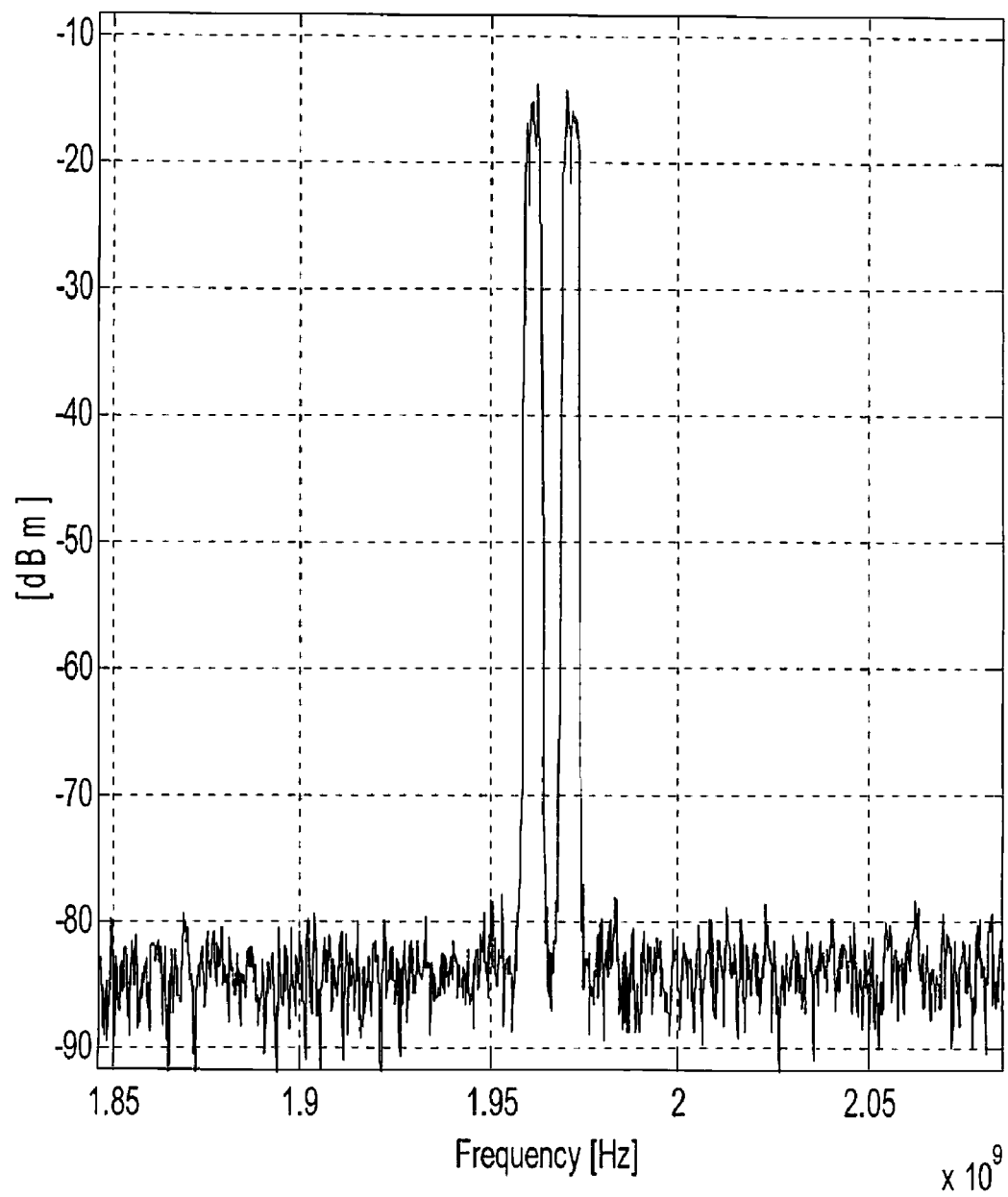
FIG. 12 illustrates a band-pass filtered amplified RF-signal, according to this invention.

FIG. 12 illustrates a magnified view of a filtered-out spectrum of a base band signal that is switched-modulated and amplified, according to the method and arrangement of this invention. The filtered-out frequencies represent the amplified original complex base band signal, and the two-carrier nature of the filtered-out signal indicates that a good dynamic range is achieved.

Figure 13:
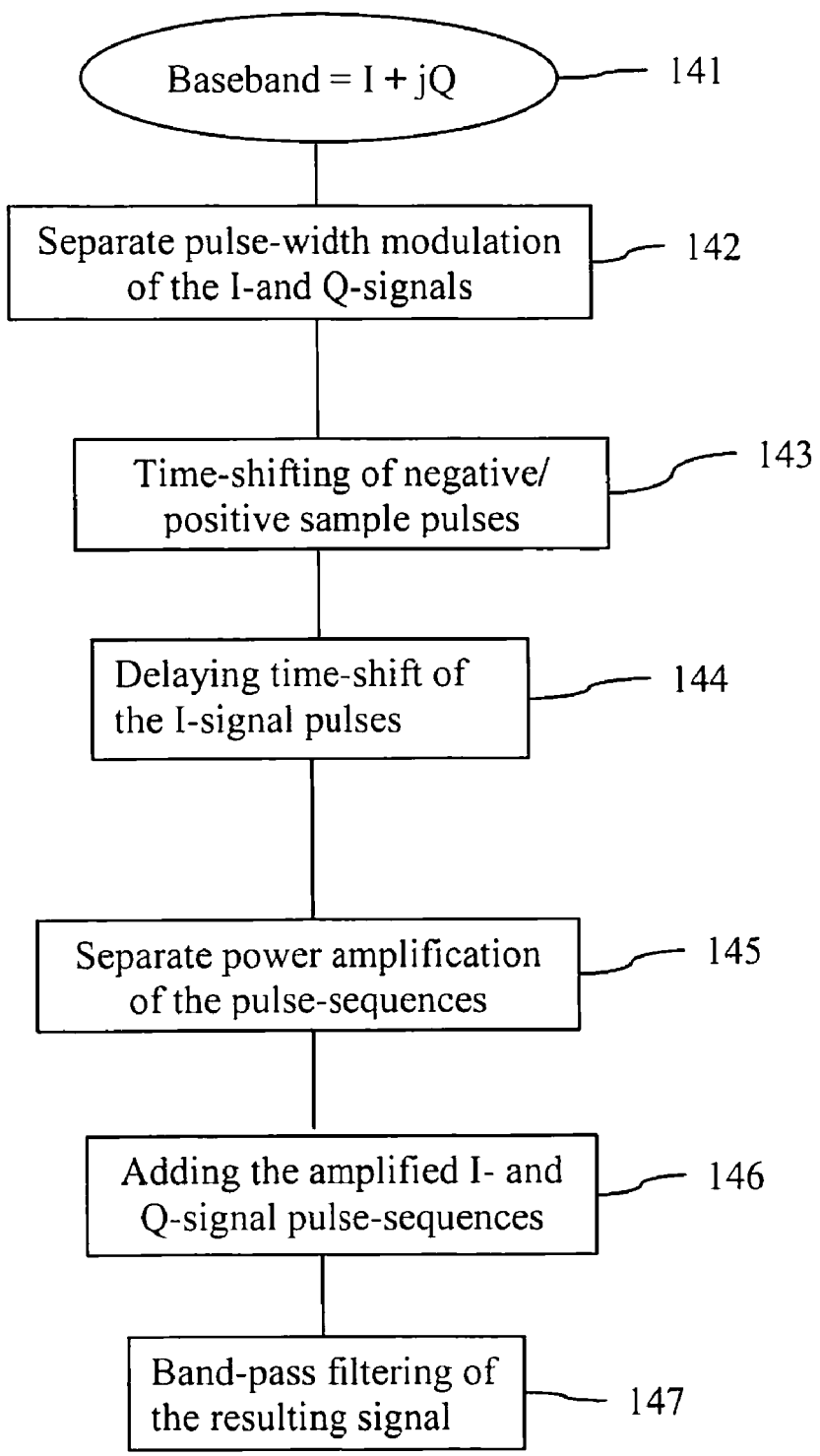
FIG. 13 is a flow chart of the method of switch-modulating a power amplifier, according to a first embodiment of this invention.

FIG. 13 is a flow chart illustrating a method of switch-modulating an input signal to a radio frequency amplifier, according to a first embodiment of this invention. The sampled input base band signal in the Cartesian complex coordinates I+j·Q, is represented by one I-signal branch and one Q-signal branch, in step 141. Thereafter, in step 142, the I- and Q-signals are input to two separate pulse width modulators for mapping of the amplitude of each sample on the width of a pulse in a pulse sequence.

A time shift of the pulses representing negative amplitudes relative the pulses representing positive amplitudes is performed in step 143, placing the positive and negative sample pulses on two different positions within the sample period, e.g. positive sample pulses on 0.25 $T_s$ and negative sample pulses on 0.75 $T_s$. In order to facilitate a simple combining of the separate I signal and Q signal branches again to re-create the complex representation I+j·Q, the pulse sequence representing the I-signal branch is delayed in step 144, e.g. by 0.25 $T_s$, which corresponds to a multiplication with j.

In step 145, the pulse sequences are amplified in two separate amplifiers, and in step 146, the amplified pulse sequences are combined to create a complex representation I+j·Q. In step 147, the amplified and combined pulse sequence is filtered in a suitable band pass filter, to obtain an amplified base band signal.

According to a second embodiment of the invention, an interpolation of new time shifted samples of the I-signal and the Q-signal is performed prior to the mapping of the samples on the width of the pulses, due to the time shifting illustrated in the steps 143 and 144 in FIG. 13. The interpolation is performed in order to calculate new sample values for the negative samples in the Q-branch that are time shifted e.g. from 0.25 $T_s$ to 0.75 $T_s$, and for the samples in the delayed I-branch, that are time shifted e.g. from 0.25 $T_s$ to 0.50 $T_s$ (the positive samples), or from 0.75 $T_s$ to 1 $T_s$s (the negative samples). According to a preferred embodiment, the interpolation comprises linear interpolation, but it may alternatively comprise any other suitable interpolation method, e.g. cubic spline interpolation.

The presented solution enables the use of pulse width modulation in switched radio frequency power amplifiers, achieving a large power efficiency. Further, the pulse width modulation is employed without requiring any up-conversion to a radio frequency, in spite of a very high sampling frequency corresponding to the radio frequency carrier frequency. Further advantages are that phase wrap-around is avoided, while a larger dynamic range than in a combined Delta-Sigma and pulse width modulation can be obtained.

While the invention has been described with reference to specific exemplary embodiments, the description is in general only intended to illustrate the inventive concept and should not be taken as limiting the scope of the invention.

The invention claimed is:

1. A method of switch-modulating a radio-frequency power amplifier, wherein an input signal into the power amplifier is represented by an I-signal and Q-signal of complex components (I+j·Q), the method comprising:
   sampling and pulse width modulating the I-signal and the Q-signal separately to generate a modulated I-signal pulse sequence and a modulated Q-signal pulse sequence;
   time shifting the pulses corresponding to negative sample values relative to the pulses corresponding to positive sample values; and
   delaying each pulse of the I-signal pulse sequence by introducing a delaying time shift.

2. The method of claim 1 further comprising interpolating new samples values to be mapped on the time shifted pulses.

3. The method of claim 1 further comprising:
   power amplifying the I-signal pulse sequence and the Q-signal pulse sequence separately;
   combining the amplified I-signal pulse sequence and the amplified Q-signal pulse sequence; and
   filtering the amplified and combined pulse sequences to generate a correct output signal.

4. The method of claim 1 wherein pulse width modulating the I-signal and the Q-signal separately comprises mapping a sample amplitude on the width of a pulse of one of the pulse sequences.

5. The method of claim 4 wherein the sample amplitude is corrected to obtain a linear function.

6. The method of claim 1 wherein the delaying time shift in the I-branch is 0.25 of a sampling interval $T_s$, and corresponds to a 90-degree phase shift.

7. The method of claim 1 wherein time shifting the negative sample pulses relative to the positive sample pulses comprises placing the negative sample pulses in a second half of a sampling interval $T_s$, and placing the positive sampling pulses in a first half of the sampling interval $T_s$.

8. The method of claim 2 wherein interpolating new sample values comprises a linear interpolation between two adjacent samples.

9. The method of claim 2 wherein interpolating new sample values involves cubic spline interpolation.

10. A circuit for switch-modulating a radio-frequency power amplifier by separately modulating an I-signal and a Q-signal of complex components (I+j·Q) of an input signal, the circuit comprising:
    one or more pulse width modulators configured to sample and modulate an I-signal and a Q-signal separately to generate a modulated I-signal pulse sequence and a modulated Q-signal pulse sequence;
    a time shifter configured to displace, within a sampling interval, those generated pulses that correspond to negative sample values relative to those generated pulses that correspond to positive sample values; and
    a delay unit configured to introduce a delaying time shift in the I-signal pulse sequence.

11. The circuit of claim 10 further comprising an interpolator configured to interpolate new sample amplitudes to be mapped on a width of each time shifted pulse.

12. The circuit of claim 10 further comprising:
    two power amplifiers configured to amplify the I-signal pulse sequence and the Q-signal pulse sequence separately;

a combiner configured to combine the amplified I-signal pulse sequence with the amplified Q-signal pulse sequence; and a filter configured to band-pass filter the combined pulse sequences to generate a correct amplified output signal.

13. The circuit of claim 10 wherein each said pulse width modulator is configured to map the sample amplitude onto the width of a pulse.

14. The circuit of claim 13 further comprising a correcting calculator configured to obtain a linear relationship between a width of the pulse and a sample amplitude.

15. The circuit of claim 10 wherein said delaying time shift is 0.25 of a sampling interval $T_s$, and corresponds to a 90-degree phase shift of the modulated I-signal pulse sequence.

16. The circuit of claim 11 wherein said interpolator comprises a cubic spline interpolator.

17. The circuit of claim 10 wherein the power amplifier is one of a Class D amplifier and a Class E amplifier.

18. The circuit of claim 11 wherein said interpolator comprises a linear interpolator.

* * * * *

UNITED STATES PATENT AND TRADEMARK OFFICE
CERTIFICATE OF CORRECTION

PATENT NO. : 7,932,790 B2
APPLICATION NO. : 12/443704
DATED : April 26, 2011
INVENTOR(S) : Rexberg et al.

It is certified that error appears in the above-identified patent and that said Letters Patent is hereby corrected as shown below:

Title Page, in Field (57), under "ABSTRACT", in Column 2, Line 3, delete "(I+j–Q)," and insert -- (I+j·Q), --, therefor.

In Column 2, Line 52, delete "PPW/PPM" and insert -- PWM/PPM --, therefor.

In Column 3, Line 14, delete "T," and insert -- $T_s$, --, therefor.

In Column 7, Line 1, delete "components" and insert -- components I --, therefor.

Figure 7:
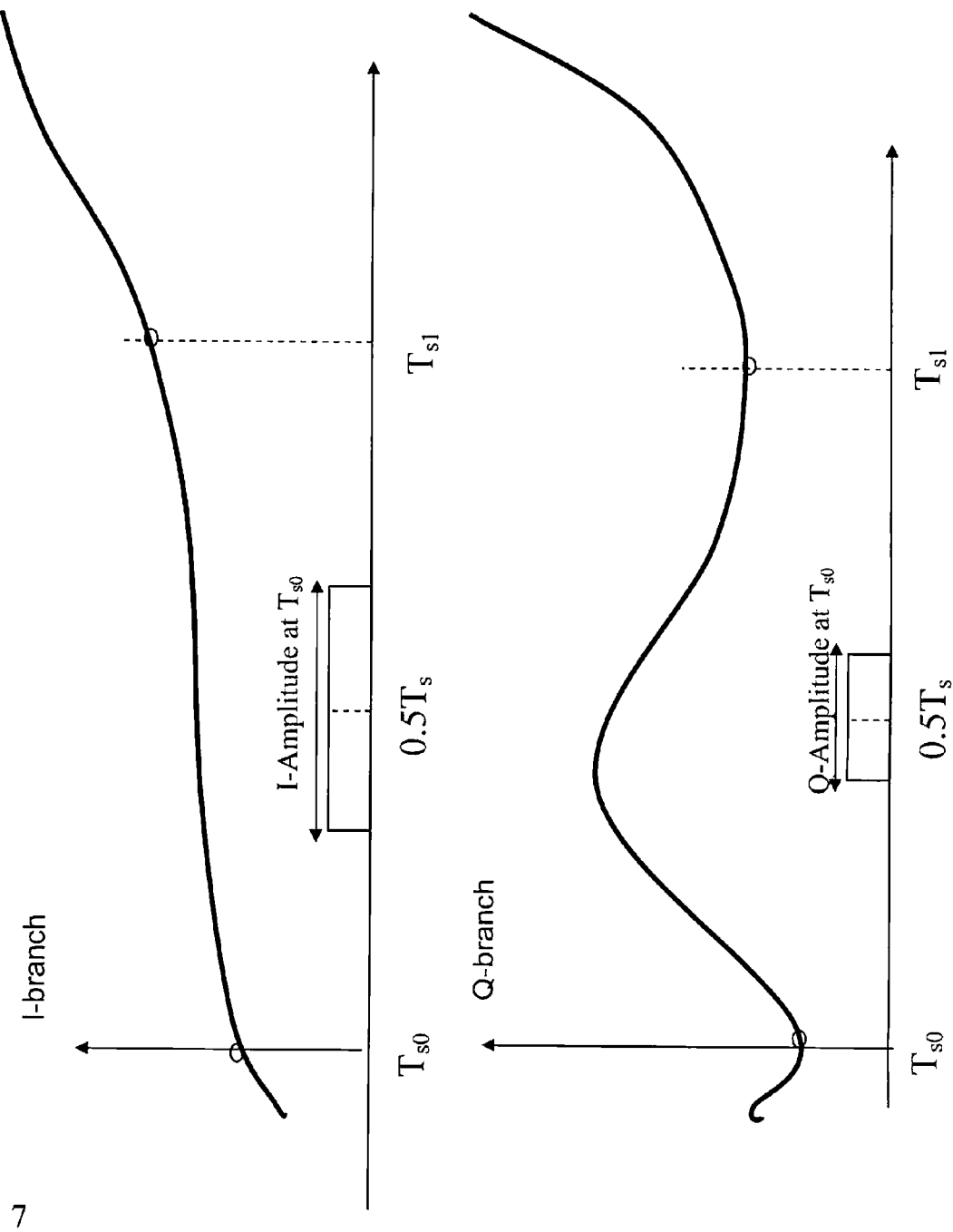
FIG. 7 illustrates mapping of the sample amplitudes of the I-branch- and Q-branch signals, according to this invention.

In Column 7, Line 10, delete "FIG. 1" and insert -- FIG. 7 --, therefor.

In Column 7, Line 24, delete "placed or" and insert -- placed on --, therefor.

In Column 8, Line 12, after "to a", delete "n".

In Column 8, Line 17, delete "0.5%." and insert -- $0.5T_s$. --, therefor.

In Column 8, Line 22, delete "$T_{soint}$." and insert -- $T_{s0int}$. --, therefor.

In Column 8, Line 42, delete "$I_{neq}$" and insert -- $I_{neg}$ --, therefor.

In Column 9, Line 54, delete "$1T_sS$" and insert -- $1T_s$ --, therefor.

Signed and Sealed this
Twenty-seventh Day of December, 2011

David J. Kappos
*Director of the United States Patent and Trademark Office*